United States Patent [19]

Foster et al.

[11] Patent Number: 4,548,159
[45] Date of Patent: Oct. 22, 1985

[54] CHEMICAL VAPOR DEPOSITION WAFER BOAT

[75] Inventors: Derrick W. Foster; Robert B. Herring, both of San Jose, Calif.

[73] Assignee: Anicon, Inc., San Jose, Calif.

[21] Appl. No.: 628,542

[22] Filed: Jul. 6, 1984

[51] Int. Cl.⁴ .............................................. C23C 11/00
[52] U.S. Cl. .................................... 118/728; 118/500; 118/732
[58] Field of Search .............. 118/500, 728, 715, 729, 118/732; 432/253; 211/40, 41

[56] References Cited

U.S. PATENT DOCUMENTS 3,660,179 5/1972 Desmond et al. ........... 427/255.1 X
3,819,067 6/1974 Hammond ...................... 432/253 X
4,098,923 7/1978 Alberti et al. ................... 118/900 X
4,466,381 8/1984 Jenkins ................................ 118/728

Primary Examiner—Norman Morgenstern
Assistant Examiner—Bernard F. Plantz
Attorney, Agent, or Firm—William B. Walker

[57] ABSTRACT

A chemical vapor deposition wafer boat for polysilicon deposition in a vertical CVD apparatus comprises upper and lower, mutually engaging, open ended hemicylinders. Gas flow passageways are present in a diffusion zone of the lower hemicylinder wall, but not in the remainder of the walls of the hemicylinder. Gas flow to the wafers is limited to diffusion flow, and the wafers are protected from particulates forming in the gas stream during the coating operation.

8 Claims, 5 Drawing Figures

U.S. Patent Oct. 22, 1985 4,548,159
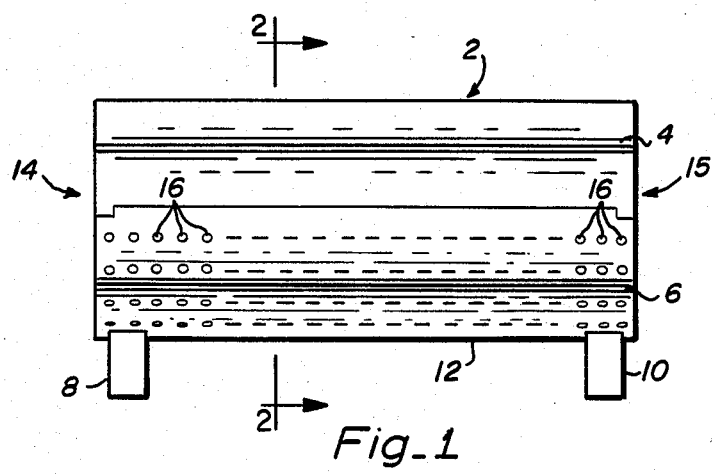
Fig_1
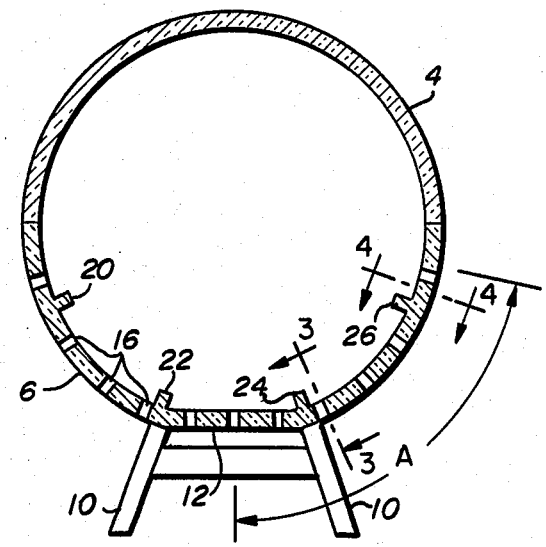
Fig_2
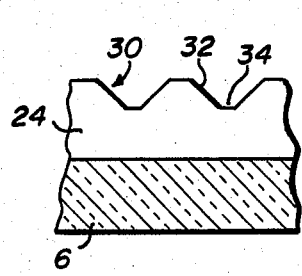
Fig_3
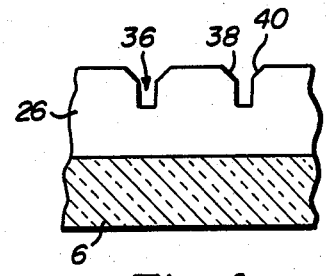
Fig_4

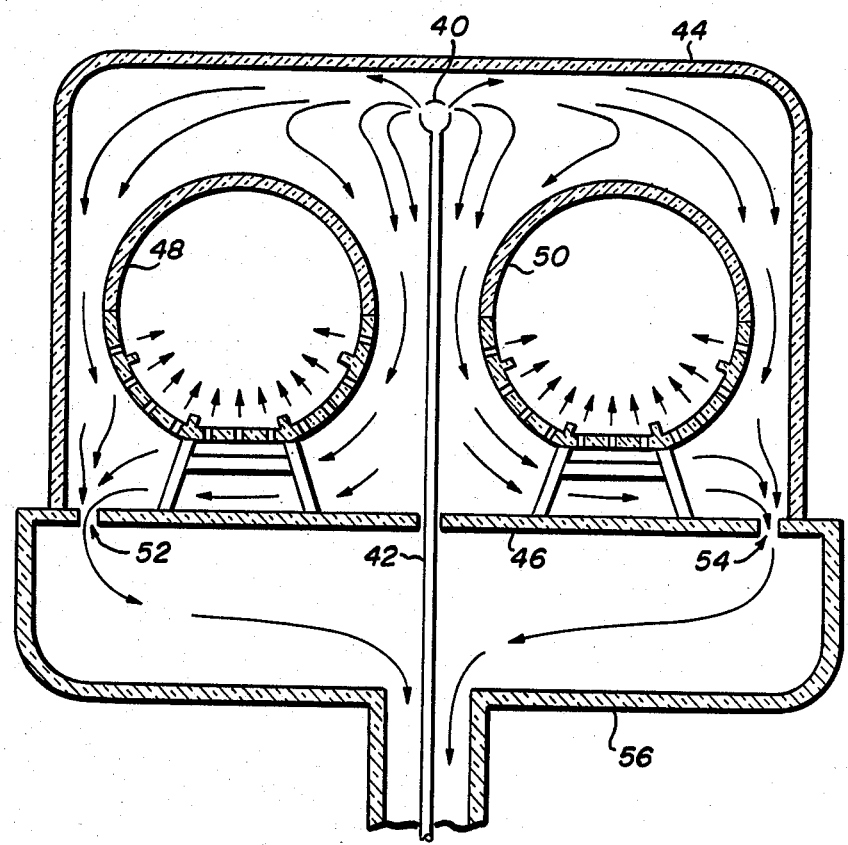
Fig._5

CHEMICAL VAPOR DEPOSITION WAFER BOAT

FIELD OF THE INVENTION

This invention relates to a chemical vapor deposition wafer boat. In particular, this invention relates to a wafer boat for use with chemical vapor deposition processes involving thermal decomposition reactions in vertical devices to produce highly uniform, uncontaminated coatings on substrates.

BACKGROUND OF THE INVENTION

Chemical vapor deposition (CVD) is the process of depositing a solid material from a gaseous phase onto a substrate by means of a chemical reaction. This deposition reaction is generally thermal decomposition, chemical oxidation, or chemical reduction. In one example of thermal decomposition, organometallic compounds are transported to the substrate surface as a vapor and are reduced to the elemental metal state on the substrate surface. For chemical reduction, the reducing agent most usually employed is hydrogen, although metal vapors can also be used. The substrate can also act as a reductant as in the case of tungsten hexafluoride reduction by silicon. The substrate can also supply one element of a compound or alloy deposit. The CVD process can be used to deposit many elements and alloys as well as compounds including oxides, nitrides and carbides.

In the present invention, thermal decomposition reactions are used to manufacture highly uniform deposits on semiconductor wafer substrates, e.g., coatings of polysilicon, and silicon nitrides formed by the dichlorosilane and ammonia process.

Chemical vapor deposition of electronic materials is described by T. L. Chu et al, *J. Bac. Sci. Technol.* 10:1 (1973) and B. E. Watts, *Thin Solid Films.* 18:1 (1973). They describe the formation and doping of epitaxial films of such materials as silicon, germanium and GaAs, for example. A summary of the chemical vapor deposition field is provided by W. A. Bryant, "The Fundamentals of Chemical Vapour Deposition", *Journal of Materials Science.* 12:1285 (1977). Low pressure CVD production of polysilicon deposits is summarized by Rosler, R. *Solid State Technology.* 63-70 (April 1977), the contents thereof being incorporated by reference.

DESCRIPTION OF THE PRIOR ART

The positioning of a plurality of wafers in a row in a vapor deposition device which has wafer supports or boats have been previously described in U.S. Pat. No. 3,471,326, for example, and placing them in a vertical orientation has been described in U.S. Pat. Nos. 3,922,467 and 4,018,183. Open wafer support boats which can be preloaded before insertion into tube furnaces are described in U.S. Pat. Nos. 4,220,116 and 4,355,974, and similar boats combined with shrouds of parallel rod gas flow turbulence producers are described in U.S. Pat. Nos. 4,203,387 and 4,309,240.

A boat comprising a perforated semicylindrical upper section and a lower semicylindrical lower section of axially parallel rods is disclosed in U.S. Pat. No. 4,256,053. Boats comprising perforated cylindrical cylinders with end closures are described in U.S. Pat. Nos. 4,098,923 and 4,232,063. These boats are designed to be preloaded and placed in conventional tube furnaces, directing non-laminar gas flow into the wafer section with some degree of turbulence. Because of the nature of the gas flow patterns, it is necessary with these devices for all surfaces to be open for gas inflow, exposing the wafer surfaces to unavoidable contamination by entrained particulate gas reaction products. In vertical reactors such as are described in commonly assigned, copending application Ser. No. 528,193 filed Aug. 31, 1983, these boats are unsuitable for providing uniform films in polysilicon deposition processes. In particular, non-uniform deposits are obtained in vertical reactors using prior art boats in polysilicon deposition processes and in depositions of silicon nitride by the dichlorosilane and ammonia process. Additionally, gas turbulence introduces coating irregularities, and gas flowing through passageways above the wafers entrain particulates which contaminate the wafer surface.

SUMMARY OF THE INVENTION

The wafer boats of this invention are wafer supports for individually supporting a plurality of wafers in an evenly spaced upright orientation. The bottom surface of each wafer boat has legs extending from each end thereof for supporting the wafer boat at least 0.2 mm above the upper surface of a wafer support plate. The legs are also designed to engage a loading fork projection of a wafer boat loading and unloading apparatus and are preferably spaced apart to straddle the loading projection. The cylinder is formed by two mutually engaging top and bottom hemicylinders with gas passageways in the bottom hemicylinder. The ends of the cylinder formed by these sections are open. Gas flow passageways are preferably present only in the gas diffusion zone of the lower hemicylinder. The gas diffusion zone is the area within 90° and preferably within 75° of vertical in a plane perpendicular to the central axis of the boat. The gas flow passageways are substantially evenly distributed in the gas diffusion zone and occupy from 0.5 to 80 and preferably from 0.5 to 20 percent of the surface area thereof.

BRIEF DESCRIPTION OF THE DRAWINGS

FIG. 1 is a side view of the cylindrical wafer boat of this invention.

FIG. 2 is a cross-sectional view of the cylindrical wafer boat of this invention taken along the line 2-2 in FIG. 1.

FIG. 3 is a fragmentary cross-sectional view of the lower wafer support rails taken along line 3—3 in FIG. 2.

FIG. 4 is a fragmentary cross-sectional view of the upper wafer support rails taken along line 4—4 in FIG. 2.

FIG. 5 is a cross-sectional representational view of the reaction chamber of the vertical CVD device showing the gas flow patterns around and in the wafer boats.

DETAILED DESCRIPTION OF THE INVENTION

FIG. 1 is a side view of the cylindrical wafer boat of this invention, and FIG. 2 is a cross-sectional view taken along the line 2—2 in FIG. 1. The central axis of the cylindrical wafer boat 2 is horizontal, and wafers supported therein for coating are supported in an upright orientation. The inner surfaces of the cylindrical walls have the shape and conform to the outer edges of the individual wafers to be coated, being precisely spaced from the edges of the wafers. The cylindrical wafer boat 2 comprises an upper hemicylindrical section 4 and a lower hemicylindrical section 6 having mutually engaging opposed surfaces which join in a horizontal plane approximately through the central axis of the cylinder 2. Leg projections 8 and 10 project from the lower surface of hemicylinder 6 and are preferably integral therewith. One pair of the legs 8 and 10 is preferably approximately 2 to 5 mm longer than the other pair, providing a slight slope from the horizontal to the central axis of the boat. The loaded wafers are thus slightly and uniformly tilted from the vertical, maintaining wafers in a precisely parallel orientation. This insures that the wafer-to-wafer distances at the top and the bottom of the wafers are the same, a critical requirement for uniform coating.

The lower surface 12 of the hemicylinder 6 can be a flat section to engage the flat lower indexing edge typically present on a wafer, if desired. The leg projections 8 and 10 maintain the wafer boat in a stable orientation, precisely positioned in the reaction zone with the lower surface thereof at least 0.2 mm and preferably at least 0.5 mm above the supporting surface.

No gas flow passageways are present in the wall comprising the upper hemicylinder 4. The gas diffusion zone portion of the lower hemicylinder 6 has gas flow passageways 16. These passageways 16 can be circular holes, as shown, or have oval, elliptical, rectangular, slotted or other cross-sectional shapes, if desired. In one embodiment, the passageways 16 are positioned throughout the diffusion zone in a substantially even distribution. The cross-sectional area of the gas flow passageways can be from 0.5 to 80 percent, preferably from 0.5 to 40, and optimally from 0.5 to 20 percent of the total outer surface area of the diffusion zone of the hemicylinder 6 (including the portions occupied by holes).

Referring to FIG. 2, the gas diffusion zone is the lower hemicylinder wall portion occupied by gas flow passageways and is with Angle A of the vertical plane in a plane perpendicular to the longitudinal axis of the cylinder. Angle A can be from 45° to 90° and is preferably from 60° to 75°.

The ends 14 and 15 of the cylinder 2 formed by the two hemicylinders 4 and 6 in the engaged position are preferably entirely open.

The legs 8 are supported by a cross-beam 18 preferably integral therewith. The legs 8 are designed to support the cylindrical wafer boat in a stable orientation during the coating operation. They are also designed to straddle and engage a loading fork projection (not shown) of a loading apparatus, by which means the boats can be automatically and rapidly loaded and unloaded from the wafer support surface. Such a loading apparatus is described in commonly assigned, copending application Ser. No. 529,415 filed Sept. 6, 1983.

FIG. 3 is a fragmentary cross-sectional view of the lower wafer support rails taken along line 3—3 in FIG. 2. The slots 30 have angularly sloped sides 32 tapering to merge with the bottom surfaces 34, maintaining the bottom of the wafers placed therein in a precisely determined spacing but leaving the wafer surface fully exposed.

FIG. 4 is a fragmentary cross-sectional view of the upper wafer support rails taken along line 4—4 in FIG. 2. The slots 36 support the wafers placed therein in the vertical orientation. They have tapered portions 38 and 40 which facilitate loading and reduce the portion of the wafer surface masked by the slots.

FIG. 5 is a cross-sectional representational view of the reaction chamber of the vertical CVD device showing the gas flow patterns around and in the wafer boats. The gas exits from the outlet 40 of the gas distributor 42 into the reaction chamber defined by the cover 44 and the support plate 46. Gas flows through the reaction chamber around the wafer boats 48 and 50, exiting through gas outlet openings 52 and 54 in the support plate 46. The support plate together with the lower bowl shaped element 56 define a gas removal system under reduced pressure. The gas flows continuously during the coating operation from the outlet 40 through the reaction chamber and out through the gas removal system.

Using thermal decomposition deposition processes in vertical reactors, prior art wafer boats yielded non-uniform, inferior coatings. Even when the hole distribution was altered to protect the wafers from turbulence, non-uniform coatings were obtained. With the particular wafer boat construction of this invention, however, highly uniform coatings were obtained in both polysilicon depositions and other thermal decomposition depositions such as silicon nitride depositions by the dichloro-silane and ammonia process. Furthermore, with the boat configuration of this invention, the wafer surfaces are protected by the boat configuration from direct impingement by turbulent gas flows, or jets or streams of gas flowing in paths. Gas flow into the boat interior is limited to diffusion. Since the wall of the upper hemicylinder 4 has no gas flow openings, it not only protects the wafers from the turbulence surrounding the gas outlet 40 but also prevents particulates formed in the reacting gases around the gas outlet 40 from reaching the wafer surfaces, eliminating a major source of the commonplace surface irregularities characteristic of the previously known devices. The gas diffusing into the boat interior through the openings 16 in the diffusion zone does not constitute a gas stream which can entrain particulates, and the particulates pass out of the system with the gas being exhausted.

The controlled gas diffusion effects edge to center and wafer to wafer coating variations of less than 2 percent and under carefully controlled conditions of less than one percent, making the process particularly suitable for manufacturing VLSI devices. The wafer boats of this invention are particularly suitable for use in the vertical CVD apparatus described in commonly assigned, copending application Ser. No. 528,193 filed Aug. 31, 1983, the entire contents of which are hereby incorporated by reference.

THe invention claimed is:

1. A cylindrical chemical vapor deposition wafer boat comprised of mutually engaging upper and lower hemicylinders, the lower hemicylinder having slot means for supporting a plurality of wafers in a preset spaced orientation perpendicular to the central axis of the cylinder and having gas diffusion openings in a gas diffusion zone, the lower hemicylinder having legs at each end thereof for supporting the wafer boat at least 2 mm above a suport surface and for engaging a wafer boat loading and unloading means, the legs at one end of the lower hemicylinder being from 2 to 5 mm longer than the legs at the other end of the lower hemicylinder, whereby the central axis of the boat is sloped from the horizontal when the boat is supported by a horizontal surface.

2. A chemical vapor deposition apparatus comprising a vapor deposition chamber having a gas inlet means positioned in the upper portion of the chamber for introducing gases into the chamber and a gas outlet means positioned in the lower portion of the chamber for removing gases from the chamber, a cylindrical wafer boat means positioned between the gas inlet means and the gas outlet means for supporting a plurality of wafers in an evenly spaced, upright orientation, the cylinder having open ends and comprised of mutually engaging upper and lower hemicylinders, the upper hemicylinder being without openings and the lower hemicylinder having gas diffusion openings in the gas diffusion zone.

3. The chemical vapor deposition apparatus of claim 2 wherein the gas diffusion zone is the portion of the lower hemicylinder wall within 90° of a vertical plane in a plane perpendicular to the longitudinal axis of the cylinder, the gas flow passageways in the gas diffusion zone are substantially evenly spaced throughout the zone, and the percentage of the total wall area of the gas diffusion zone occupied by the gas flow passageways is within the range of from 0.5 to 80 percent.

4. The chemical vapor deposition apparatus of claim 3 wherein said percentage is within the range of from 0.5 to 40 percent.

5. The chemical vapor deposition apparatus of claim 3 wherein said percentage is within the range of from 0.5 to 20 percent.

6. The chemical vapor deposition apparatus of claim 3 wherein the gas diffusion zone is in the portion of the lower hemicylinder wall within 75° of vertical.

7. The chamical vapor deposition apparatus of claim 3 wherein the lower hemicylinder has leg means for supporting the wafer boat means at least 2 mm above a support surface and for engaging a wafer boat loading and unloading means.

8. The chemical vapor deposition apparatus of claim 3 wherein the lower hemicylinder has slot means for supporting a plurality of wafers in a preset spaced orientation perpendicular to the central axis thereof and leg means comprising legs at each end of the lower hemicylinder for supporting the wafer boat at least 2 mm above a support and for engaging a wafer boat loading and unloading means, the legs at one end of the lower hemicylinder being from 2 to 5 mm longer then the legs at the other end of the lower hemicylinder, whereby the central axis of the boat means is sloped from the horizontal when the boat means is supported by a horizontal surface.

* * * * *